(12) United States Patent
Lu et al.

(10) Patent No.: US 8,785,084 B2
(45) Date of Patent: Jul. 22, 2014

(54) METHOD FOR MASK FABRICATION AND REPAIR

(75) Inventors: Yen-Cheng Lu, New Taipei (TW); Shinn-Sheng Yu, Hsinchu (TW); Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 25 days.

(21) Appl. No.: 13/602,916

(22) Filed: Sep. 4, 2012

(65) Prior Publication Data
US 2014/0065521 A1    Mar. 6, 2014

(51) Int. Cl.
*G03F 1/72*    (2012.01)
*G03F 1/84*    (2012.01)
*G03F 1/24*    (2012.01)

(52) U.S. Cl.
USPC .......................................................... 430/5

(58) Field of Classification Search
CPC ................ G03F 1/24; G03F 1/72; G03F 1/84
USPC .......... 430/5; 382/144; 250/396 R; 356/237.2
See application file for complete search history.

(56) References Cited

U.S. PATENT DOCUMENTS

| | | |
|---|---|---|
| 6,821,682 B1 | 11/2004 | Stearns et al. |
| 7,901,843 B2 * | 3/2011 | Sugiyama et al. ............... 430/5 |
| 2007/0077499 A1 * | 4/2007 | Ikuta et al. ...................... 430/5 |
| 2008/0318138 A1 | 12/2008 | Holfeld |

FOREIGN PATENT DOCUMENTS

WO     WO 00/34828     6/2000

* cited by examiner

*Primary Examiner* — Stephen Rosasco
(74) *Attorney, Agent, or Firm* — Haynes and Boone, LLP

(57) ABSTRACT

A method for repairing phase defects for an extreme ultraviolet (EUV) mask is disclosed. The method includes receiving a patterned EUV mask with at least one phase-defect region, determining location and size of the phase-defect region, depositing an absorber material to cover the phase-defect region and removing a portion of the patterned absorption layer near the phase-defect region in the patterned EUV mask to form an absorber-absent region.

20 Claims, 5 Drawing Sheets

METHOD FOR MASK FABRICATION AND REPAIR

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. Masks used in EUVL presents new challenges. For example, a multi-layer (ML) structure is used in an EUVL mask and a microscopic non-flatness (caused by a defect, for example) on a surface of the substrate of the EUV mask may deform the films deposited subsequently thereon. When an incident light is reflected from a deformed region, it may experience a phase difference with respect to a light reflected from a normally formed region. Sometimes a defect introduces a phase difference close to 180°, referred to as a phase defect. A phase defect may affect print fidelity and result a severe pattern distortion on a wafer. It is desired to provide an efficient and a feasible method to reduce and/or mitigate the printability of phase defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
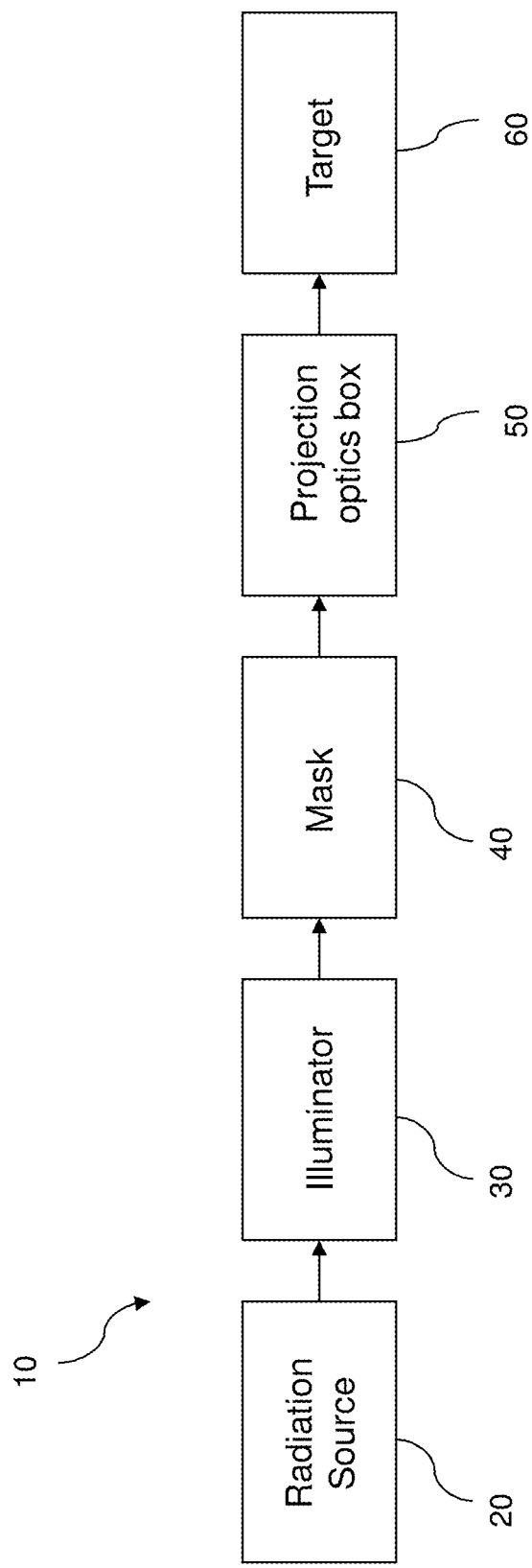
FIG. 1. is a block diagram of a lithography process for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography process 10 that may benefit from one or more embodiments of the present invention is disclosed. The EUV lithography process 10 employs an EUV radiation source 20 having a wavelength of about 1-100 nm.

The EUV lithography process 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto the mask 40. In the EUV wavelength range, reflective optics is employed generally. Refractive optics, however, can also be realized by e.g., zoneplates.

The EUV lithography process 10 also employs a mask 40 (in the present disclosure, the terms of mask, photomask, and reticle are used to refer to the same item). The mask 40 can be a transmissive mask or a reflective mask. In the present embodiment, the mask 40 is a reflective mask such as described in further detail below. The mask 40 may incorporate other resolution enhancement techniques such as phase-shifting mask (PSM) and/or optical proximity correction (OPC).

The EUV lithography process 10 also employs a projection optics box (POB) 50. The POB 50 may have refractive optics or reflective optics. The radiation reflected from the mask 40 (e.g., a patterned radiation) is collected by the POB 50. The POB 50 may include a magnification of less than one (thereby reducing the patterned image included in the radiation).

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The following description refers to the mask 40 and mask fabrication and repairing processes. The mask fabrication and repairing processes include three steps: a blank mask fabrication process, a mask patterning process and a mask repairing process. During the blank mask fabrication process, a blank mask is formed by depositing suitable layers (e.g., multiple reflective layers) on a suitable substrate. The blank mask is patterned during the mask patterning process to have a design pattern for a layer of an integrated circuit (IC) device (or chip). A mask repairing process may be implemented before or after the mask patterning process to mitigate the printability of defects on the blank mask or on the patterned mask. After repairing, the patterned mask is then used to transfer the design pattern onto a semiconductor wafer. The design pattern can be transferred over and over onto multiple wafers through various lithography processes. Several masks (for example, a set of 15 to 30 masks) may be used to construct a complete IC device.

In general, various masks are fabricated for use in various processes. Types of EUV masks include binary intensity masks (BIM) and phase-shifting masks (PSM). An example BIM includes an almost totally absorptive region (also referred to as a dark region) and a reflective region. In the opaque region, an absorber is present and an incident light is almost fully absorbed by the absorber. In the reflective region, the absorber is removed and the incident light is reflected by a multilayer (ML). A PSM includes an absorptive region and a reflective region. The phase difference (generally) 180° between a portion of a light reflected from the absorptive region and a portion of the light reflected from the reflective region enhances resolution and image quality. The PSM can be an attenuated PSM (AttPSM) or an alternating PSM (AltPSM). An AttPSM usually has a reflectivity of 2%-15% from its absorber, while an AltPSM usually has a reflectivity of larger than 50% from its absorber.

Figure 2:
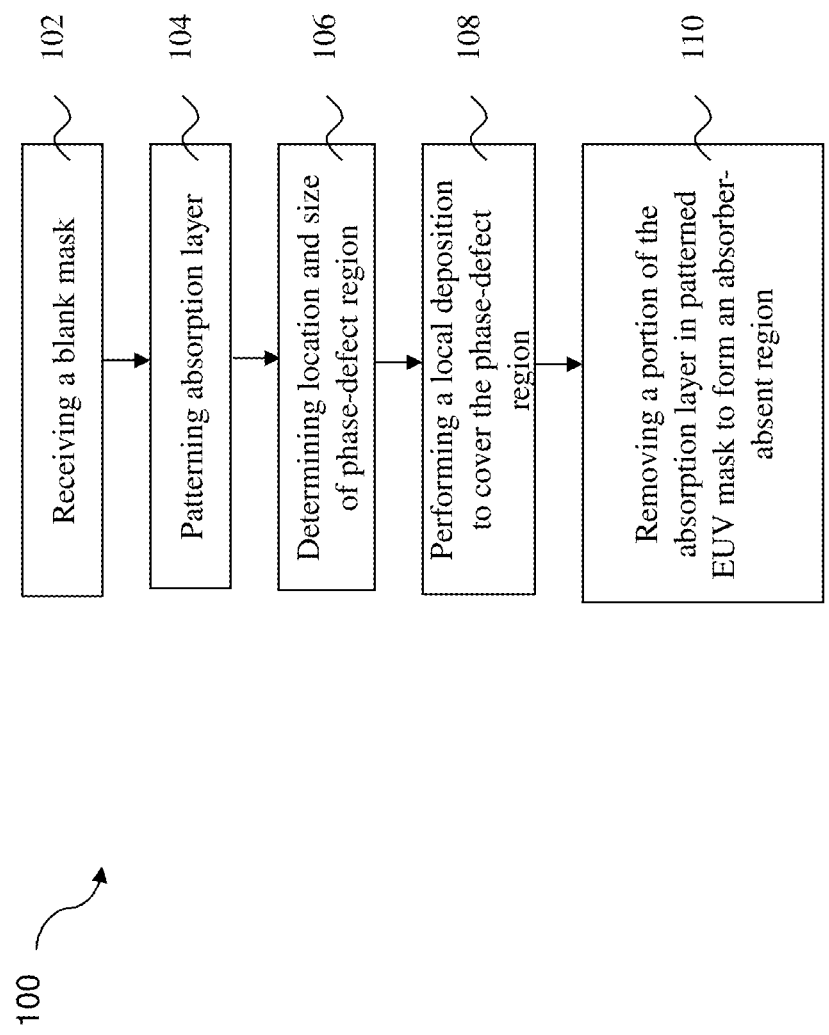
FIG. 2 is a flow chart of an example method for repairing an EUV mask according to various aspects of the present disclosure.
Figure 3:
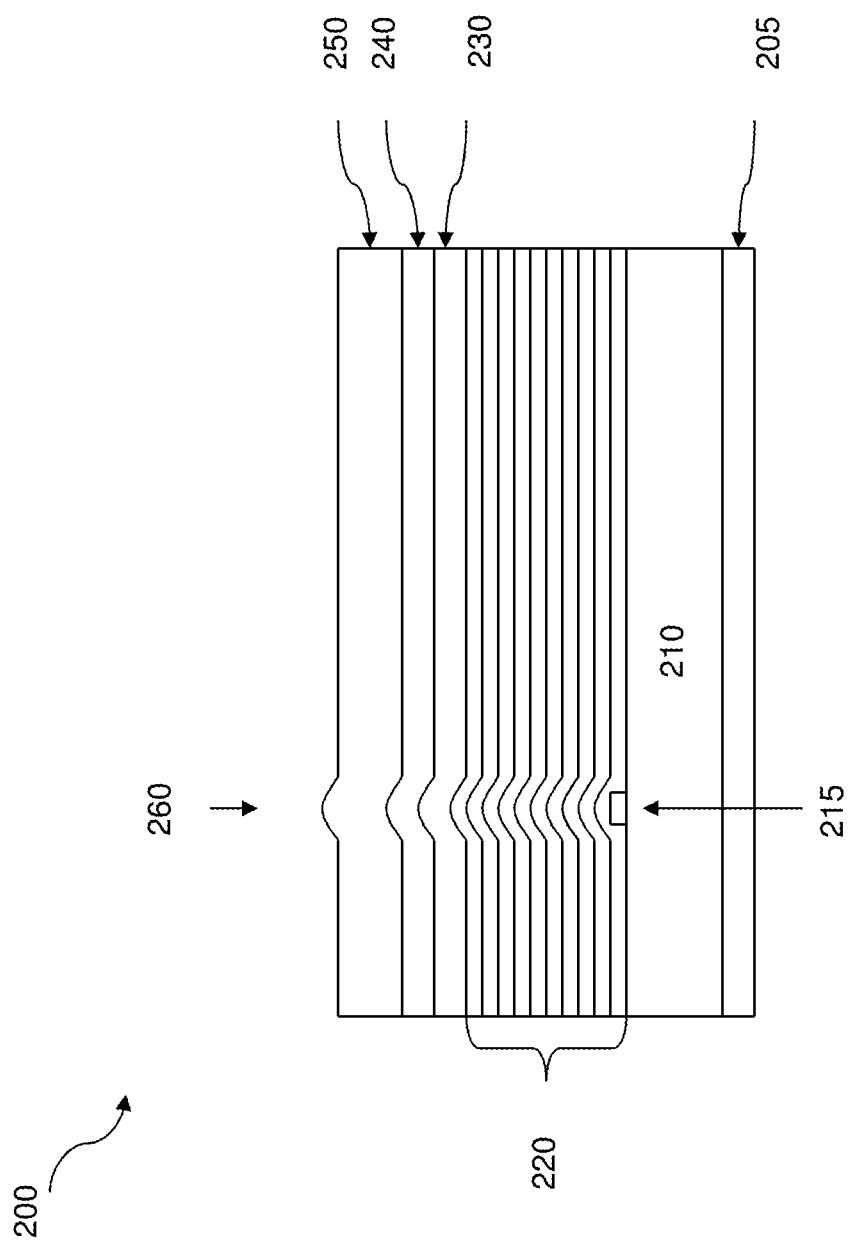
FIGS. 3 and 4 illustrate cross sectional views of one embodiment in various stages for repairing an EUV mask according to various aspects of the present disclosure.
Figure 4:
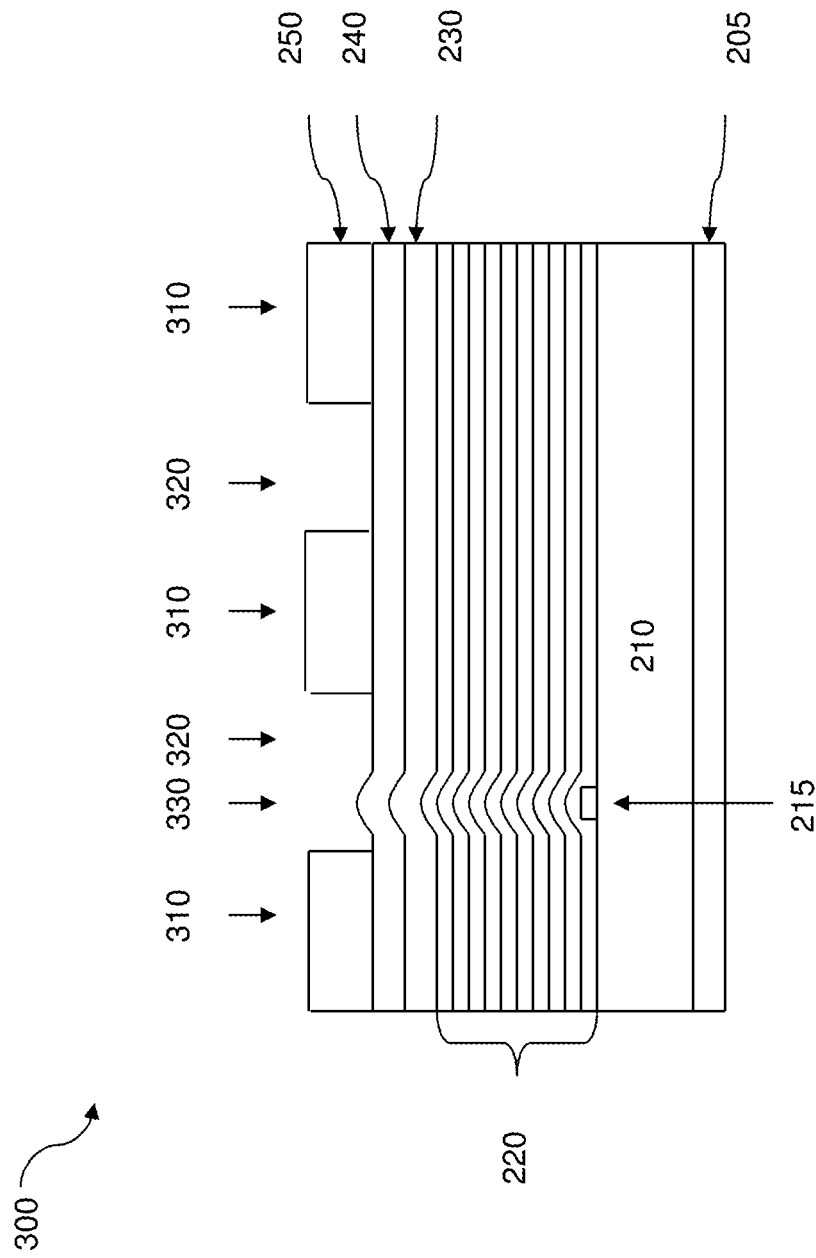
Figure 5:
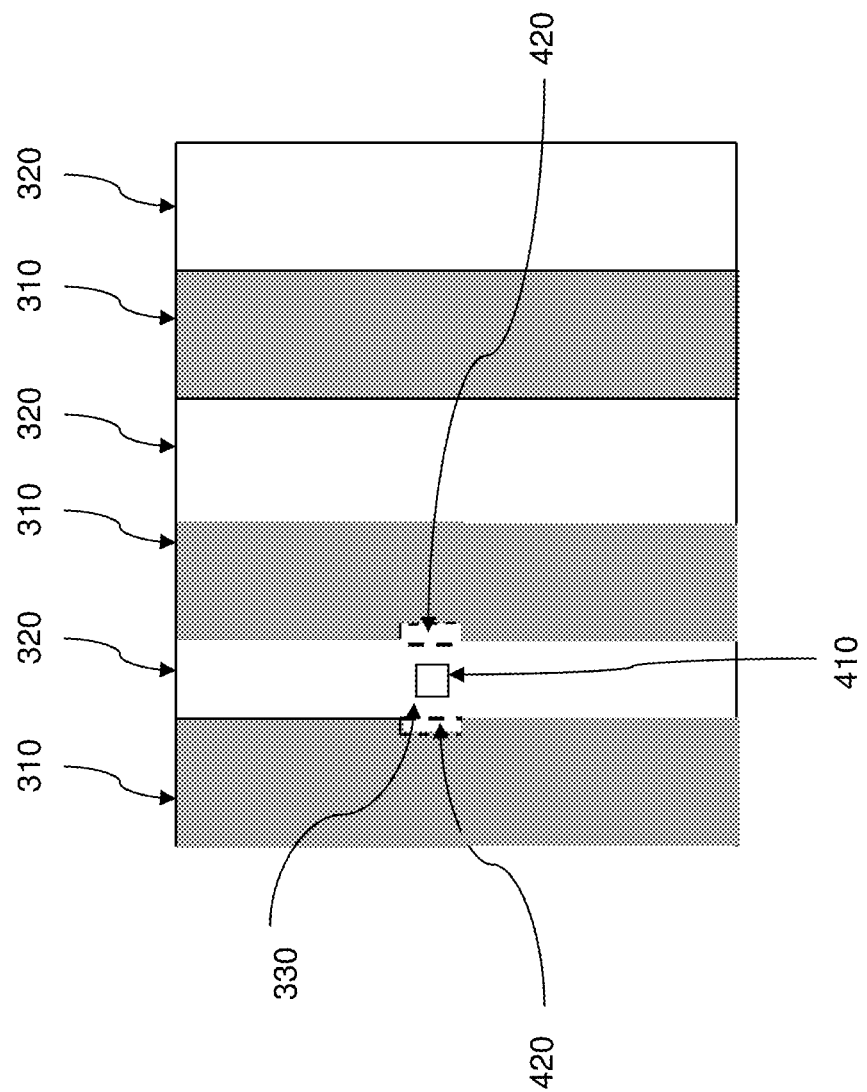
FIG. 5 is a diagrammatic top view of an patterned EUV mask in various stages according to various aspects of the present disclosure.

FIG. 2 is a flowchart of a method 100 of fabricating and repairing an EUV mask constructed according to aspects of the present disclosure. FIG. 3 is a cross-sectional view of one embodiment of a blank mask 200 at various fabrication stages of the method 100. FIG. 4 is a cross-sectional view of one embodiment of a patterned EUV mask 300 at various fabrication stages of the method 100. FIG. 5 is a diagrammatic top view of a patterned EUV mask at various repairing stages of the method 100.

Referring to FIGS. 2 and 3, the method 100 begins at step 102 by receiving a blank mask 200. The blank mask 200 includes a substrate 210 made of low thermal expansion material (LTEM). The LTEM material may include $TiO_2$ doped $SiO_2$, and/or other low thermal expansion materials known in the art. The LTEM substrate 210 serves to minimize image distortion due to mask heating. In addition, a conductive layer 205 may be deposited under (as shown in the figure) the LTEM substrate 210 for the electrostatic chucking purpose. In an embodiment, the conductive layer 205 includes chromium nitride (CrN), though other compositions are possible.

The blank mask 200 also includes a reflective multilayer (ML) 220 deposited over the LTEM substrate 210. The ML 220 includes a plurality of film pairs, such as molybdenum-silicon (Mo/Si) film pairs (e.g., a layer of molybdenum above or below a layer of silicon in each film pair). Alternatively, the ML 220 may include molybdenum-beryllium (Mo/Be) film pairs, or any two materials or two material combinations with large difference in refractive indices and small extinction coefficients. The thickness of each layer of the ML 220 depends on the wavelength and the angle of incidence of the incident light. For a specified angle of incidence, the thickness of each layer of the ML 220 is adjusted to achieve maximal constructive interference for lights reflected at different interfaces of the ML 220. A typical number of film pairs is 20-80, however any number of film pairs is possible. In an embodiment, the ML 220 includes forty pairs of layers of Mo/Si. Each Mo/Si film pair has a thickness of about 7 nm, e.g., about 3 nm for Mo and about 4 nm for Si. In this case, a reflectivity of about 70% is achieved.

Referring specifically to FIG. 3, in the present embodiment, the blank mask 200 includes at least one defect 215, such as a bump or a pit, on the surface of the LTEM substrate 210 (beneath the ML 220) or embedded in the ML 220. The defect 215 may form during fabricating the LTEM substrate 210, the ML 220, or any other process. For the sake of example, the defect 215 includes a bump or a pit and has a height (for the bump) or a depth (for the pit) of about one forth of the wavelength of the radiation source 20. For example, the height of the defect 215 is about 3.4 nm when a 13.5 nm EUV radiation source 20 is employed. The defect 215 may cause local deformation of all subsequent layers above it to form a deformation region 260, as shown in FIG. 3

A capping layer 230 is formed above the ML 220 to prevent oxidation of the ML. In the present embodiment, the capping layer 230 includes silicon with about 4-7 nm thickness. A buffer layer 240 is formed above the capping layer 230 to act as an etching stop layer in a patterning or repairing process of an absorption layer, which will be described later. The buffer layer 240 has different etching characteristics from the absorption layer. The buffer layer 240 includes ruthenium (Ru), Ru compounds such as RuB, RuSi, chromium (Cr), Cr oxide, and Cr nitride. A low temperature deposition process is often chosen for the buffer layer to prevent inter-diffusion of the ML 220. In the present embodiment, the buffer layer contains ruthenium and its thickness is 3-5 nm.

An absorption layer 250 is formed above the buffer layer 240. In the present embodiment, the absorption layer 250 absorbs radiation in the EUV wavelength range projected onto a patterned mask. The absorption layer 250 includes multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above. With a proper configuration of multiple film layers, the absorption layer 250 will provide process flexibility in a subsequent etching process by different etch characteristics of each film.

One or more of the layers 205, 220, 230, 240 and 250 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Referring to FIGS. 2 and 4, the method 100 proceeds to step 104 by patterning the absorption layer 250 to form the design layout patterned EUV mask 300. A patterning process may include lithography and etching processes. A lithography process may include resist coating (e.g., spin-on coating), soft baking, mask aligning, exposure, post-exposure baking, developing the resist, rinsing, drying (e.g., hard baking), other suitable processes, and/or combinations thereof. The exposure is accomplished by electron beam direct writing or multiple electron beam direct writing. Next, an etching process is performed to remove portions of the absorption layer 250. The etching process may include dry (plasma) etching, wet etching, and/or other etching methods.

The patterned EUV mask 300 includes absorptive regions 310 and reflective regions 320. At least one of the reflective regions 320 includes a defect region 330. The defect region 330 results due to the presence of the defect 215 beneath or embedded in the ML 220. This is because the defect 215 will lead to deformation of all subsequent layers of the ML 220 above it. The defect region 330 may have a small impact on the amplitude of a light reflected from the reflective region 320 where the defect region 330 is located. However, it can have large impact on the phase of the light. (This is the reason why such a defect is called a phase defect in the literature. From now on, we will use the terminology "the phase-defect region 330"). For example, if the height of the defect 215 is about 3.4 nm, i.e., about one fourth of the imaging wavelength when the imaging wavelength is 13.5 nm, the phase shift is about 180°. In fact, a phase error of only a small portion of 180°, e.g., 20°, can have a prominent impact on the lithographic process window or even cause patterning fidelity problems. Therefore, a defect-free LTEM substrate 210 and a defect-free ML 220 are desired. However, this put constrains in a mask fabrication and may make the mask fabrication become more expensive. The present disclosure offers a different approach to reduce impacts of phase defects.

The method 100 proceeds to step 106 by determining location and size of the phase-defect region 330. The location and size of the phase-defect region 330 may be detected by atomic force microscopy (AFM), aerial image metrology system (AIMS™, by Carl Zeiss) or other defect metrology tools. In the present embodiment, such two-dimensional (2D) information as location and size of the phase-defect region 330 is sufficient. The 2D information is in a plane which is parallel to the surface of the LTEM substrate 210. The detailed three-dimensional (3D) profile of the phase-defect region 330, which is necessary for an accurate determination of the resultant phase error, is not required.

Referring to FIGS. 2 and 5, the method 100 proceeds to step 108 by performing a local deposition to cover the phase-defect region 330 with an absorber material 410. After being covered by the absorber material 410, the reflectivity in the phase-defect region 330 becomes small, e.g., smaller than 3%. Thus, the phase shift, no matter how large it is, becomes immaterial. The absorber material 410 may contain chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above. The absorber material 410 can be different from the material for the absorption layer 250 (or mixture of above, can be different from that material of the absorber layer 250). The absorber material 410 is deposited locally by using gas-assisted focused-electron-beam-induced deposition, or any other suitable method. A shape of the deposited absorber material 410 corresponds to the phase-defect region 330. More specifically, the deposited region is a region with unacceptably large phase error.

In one embodiment, before depositing the absorber material 410, the ML 220 is removed or partially removed in the phase-defect region 330 by a local etching process and the absorber material 410 is deposited in the phase-defect region 330 after the removal or the partial removal of the ML 220.

The method 100 proceeds to step 110 by removing a portion of the absorption layer 250 on the patterned EUV mask 300 to form an absorber-absent region 420 in the absorptive region 310. The absorber-absent region 420 is near the region of the deposited absorber material 410. The absorber-absent region 420 is formed by a suitable technique, such as focused-ion-beam etching or focused-electron-beam-induced etching. The absorber-absent region 420 provides additional reflected lights to compensate intensity loss at the phase-defect region 330 due to deposition of the absorber material 410 so that the aerial image is restored on the target 60 (such as a wafer). In the present embodiment, a shape of the absorber-absent region 420 is related to the region of the deposited absorber material 410. The optimal shape of the absorber-absent region 420 can be determined by a feedback loop involving aerial image or resist image metrology (by AIMS for a mask or SEM for a wafer) and mask repair. Simulation can also be employed if a model is provided.

The present disclosure provides a method for repairing phase defects in an extreme ultraviolet (EUV) mask. The method includes receiving a patterned EUV mask with at least one phase-defect region resulting from a bump-type or pit-type defect on the surface of the LTEM substrate or embedded in the ML, determining the location and size of the resultant phase-defect region, depositing an absorber material in the phase-defect region and removing a portion of the patterned absorption layer near the phase-defect region in the patterned EUV mask to form an absorber-absent region.

In another embodiment, an extreme ultraviolet (EUV) mask includes a patterned EUV mask. The patterned EUV mask includes a low thermal expansion material (LTEM) substrate, a reflective multilayer (ML) above the surface of the LTEM substrate, a bump-type or pit-type defect on the surface of the LTEM substrate or embedded in the reflective ML, a resultant phase-defect region and a patterned absorption layer above the ML. The EUV mask also includes an absorber material which covers the phase-defect region. A portion of the patterned absorption layer near the phase-defect region in the patterned EUV mask is removed to form an absorber-absent region in the EUV mask.

In yet another embodiment, a method for repairing a phase defect in an extreme ultraviolet (EUV) mask includes receiving a patterned EUV mask. The patterned EUV mask includes an absorptive region and a reflective region having at least one phase-defect region. The method also includes determining such two-dimensional (2D) information as location and size of the phase-defect region by a profile of the mask top surface (measured by atomic force microscopy (AFM)) or an aerial image intensity distribution (measured by aerial image metrology system (AIMS)), depositing an absorber material to cover the phase-defect region with a shape corresponding to the location and size of the phase-defect region and removing a portion of the patterned absorption layer near the phase-defect region in the patterned EUV mask to form an absorber-absent region with a shape corresponding to the location and size of the phase-defect region.

Based on the above, it can be seen that the present disclosure offers the mask fabrication and repair method 100. The method 100 reduces printability of a phase-defect region by covering the phase-defect region with an absorber material and removing a portion of an absorption layer near the phase-defect region in the patterned EUV mask. The method 100 requires such 2D information of the phase-defect region as location and size. The method 100 demonstrates capability to repair a phase-defect region with a wide range of phase error. The method 100 employs a quite straightforward local deposition and etching process with shape flexibility. The method 100 provides a mask repair method having broad applicability and simplicity.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for repairing a phase defect in an extreme ultraviolet (EUV) mask, the method comprising:
   receiving a patterned EUV mask, the patterned EUV mask including:
      an absorptive region, and
      a reflective region having at least one phase-defect region;
   determining location and size of the phase-defect region;
   depositing an absorber material to cover the phase-defect region; and
   removing a portion of the absorptive region near the phase-defect region in the patterned EUV mask to form an absorber-absent region.

2. The method of claim 1, wherein the patterned EUV mask includes:
   a low thermal expansion material (LTEM) substrate;
   a reflective multilayer (ML) above a surface of the LTEM substrate;
   a conductive layer above an opposite surface of the LTEM substrate;
   a capping layer above the reflective ML;
   a buffer layer above the capping layer; and
   a patterned absorption layer above the buffer layer.

3. The method of claim 2, wherein a defect is located on the surface of the LTEM substrate and beneath the ML.

4. The method of claim 3, wherein the phase-defect region results from the defect.

5. The method of claim 3, wherein the defect is of bump-type.

6. The method of claim 3, wherein the defect is of pit-type.

7. The method of claim 1, wherein the size and location of the phase-defect region is determined by atomic force microscopy (AFM).

8. The method of claim 1, wherein the size and location of the phase-defect region is determined by aerial image metrology system (AIMS).

9. The method of claim 1, wherein the absorber material includes one or more from the group consisting of chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, and molybdenum.

10. The method of claim 1, wherein the absorber material is deposited locally to cover the phase-defect region in the patterned EUV mask.

11. The method of claim 10, wherein a shape of the deposited absorber material corresponds to the location and size of the phase-defect region.

12. The method of claim 1, wherein the absorber-absent region is formed by a local etching process.

13. The method of claim 12, wherein a shape of the absorber-absent region corresponds to the location and size of the phase-defect region.

14. The method of claim 1, wherein a full thickness of the ML in the phase-defect region is removed by an etching process before depositing the absorber material.

15. The method of claim 1, wherein a portion of the ML in the phase-defect region is removed by an etching process before depositing the absorber material.

16. The method of claim 15, wherein the absorber material is deposited in the phase-defect region after removal of the ML.

17. An extreme ultraviolet (EUV) mask, comprising:
   a patterned EUV mask, the patterned EUV mask including:
      a low thermal expansion material (LTEM) substrate;
      a reflective multilayer (ML) above the surface of the LTEM substrate;
      a defect on the surface of the LTEM substrate or embedded in the reflective ML;
      a patterned absorption layer above the ML to create a reflective region and an absorptive region;
      a resultant phase-defect region in the reflective region;
      an absorber material covering the phase-defect region; and
      an absorber-absent region in the absorptive region near the phase-defect region.

18. The mask of claim 17, wherein the absorber material has a shape corresponding to the phase-defect region.

19. The mask of claim 17, wherein the absorber-absent region has a shape corresponding to the phase-defect region.

20. A method for repairing a phase defect in an extreme ultraviolet (EUV) mask, the method comprising:
   receiving a patterned EUV mask, the patterned EUV mask including:
      an absorptive region; and
      a reflective region having at least one phase-defect region;
   determining location and size of the phase-defect region by one of atomic force microscopy (AFM) and aerial image metrology system (AIMS);
   depositing an absorber material to cover the phase-defect region with a shape corresponding to the location and size of the phase-defect region; and
   removing a portion of the absorptive region near the phase-defect region in the patterned EUV mask to form an absorber-absent region with a shape corresponding to the location and size of the phase-defect region.

* * * * *